United States Patent
Xu et al.

(10) Patent No.: US 7,566,626 B1
(45) Date of Patent: Jul. 28, 2009

(54) SYSTEM AND METHOD FOR PROVIDING A FULLY SELF ALIGNED BIPOLAR TRANSISTOR USING MODIFIED CAVITY FORMATION TO OPTIMIZE SELECTIVE EPITAXIAL GROWTH

(75) Inventors: Mingwei Xu, South Portland, ME (US); Jamal Ramdani, Scarborough, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 152 days.

(21) Appl. No.: 11/805,417

(22) Filed: May 23, 2007

(51) Int. Cl.
*H01L 21/331* (2006.01)

(52) U.S. Cl. .............. 438/343; 257/E27.055

(58) Field of Classification Search .......... 257/E27.055, 257/592, 593, E29.185, E21.379, 565, 588; 438/309, 311, 341, 343, 359, 360, 361, 362, 438/363, 364

See application file for complete search history.

(56) References Cited

U.S. PATENT DOCUMENTS

| | | | |
|---|---|---|---|
| 6,043,554 A * | 3/2000 | Miwa | 257/588 |
| 7,018,778 B1 | 3/2006 | Leibiger et al. | |
| 2001/0017399 A1* | 8/2001 | Oda et al. | 257/565 |
| 2005/0142787 A1 | 6/2005 | Ko | |
| 2006/0054595 A1* | 3/2006 | Starzynski | 216/57 |

OTHER PUBLICATIONS

P. Chevalier, et al., "230 GHz self-aligned SiGeC HBT for 90 nm BiCMOS technology", 2004 IEEE, pp. 225-228.

* cited by examiner

*Primary Examiner*—Davienne Monbleau
*Assistant Examiner*—Shweta Mulcare (57) ABSTRACT

A system and method are disclosed for providing a fully self aligned bipolar transistor using modified cavity formation to optimize selective epitaxial growth. A collector of a transistor is formed and at least two layers of silicon oxide are formed above the collector and covered with a polysilicon external raised base. Then an emitter window is etched through the polysilicon external raised base down to the top layer of silicon oxide. A wet etch process is performed to form a cavity in the at least two layers of silicon oxide. Different wet etch rates of the silicon layers with respect to the wet etch process cause the cavity to be formed with a shape that optimizes selective epitaxial growth in the cavity. Polysilicon rich corners and a monocrystalline silicon base are then formed within the cavity.

20 Claims, 7 Drawing Sheets

SYSTEM AND METHOD FOR PROVIDING A FULLY SELF ALIGNED BIPOLAR TRANSISTOR USING MODIFIED CAVITY FORMATION TO OPTIMIZE SELECTIVE EPITAXIAL GROWTH

TECHNICAL FIELD OF THE INVENTION

The system and method of the present invention is generally directed to the manufacture of integrated circuits and, in particular, to a system and method for providing a fully self aligned bipolar transistor using modified cavity formation to optimize selective epitaxial growth.

BACKGROUND OF THE INVENTION

Fully self aligned architectures in bipolar transistors are advantageous is that they provide better window downscaling and lower levels of parasitic capacitances and parasitic resistances. A critical step in the formation of a fully self aligned bipolar transistor is the formation of a cavity for the selective epitaxial growth (SEG) of the base portion of the transistor. For example, consider the prior art method for manufacturing a fully self aligned bipolar transistor shown in FIG. 1 and in FIG. 2.

Figure 1:
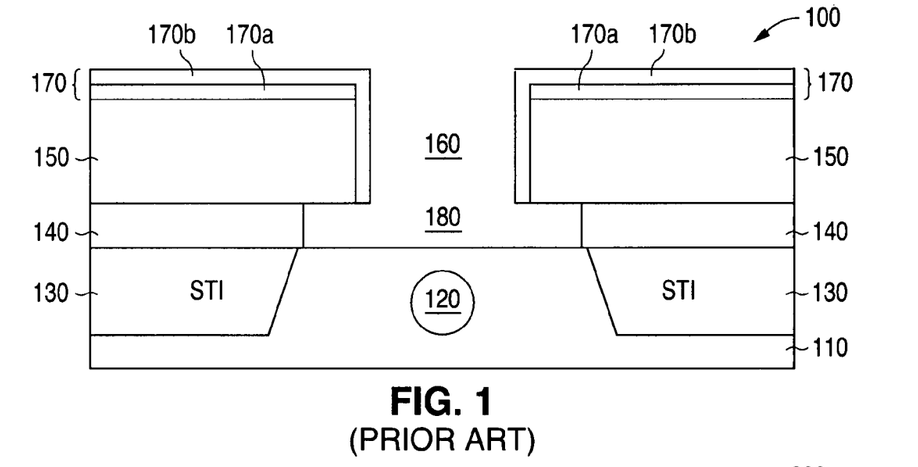
FIG. 1 illustrates a schematic diagram of a cross section of an intermediate structure formed during the manufacture of a prior art fully self aligned bipolar transistor showing an emitter window and a cavity for receiving a base structure.

FIG. 1 illustrates a schematic diagram of a cross section of an intermediate structure 100 formed during the manufacture of a prior art fully self aligned bipolar transistor showing a cavity formed over the collector portion of the transistor. The intermediate structure 100 shown in FIG. 1 comprises a Non-Selective Epitaxial Growth (NSEG) collector 110 and a selective implanted collector (SIC) 120 located within a central portion of the NSEG collector 110. The central portion of the NSEG collector 110 is located between two shallow trench isolation (STI) structures 130. During the manufacture of the intermediate structure 100 shown in FIG. 1, a layer of silicon oxide 140 (e.g., tetraethyloxysilane 140) is placed over the NSEG collector 110 and over the STI structures 130.

Then a layer of in-situ doped polysilicon material 150 is placed over the layer of silicon oxide 140 to form a raised external base. Then a first layer of silicon nitride 170a is formed over the polysilicon material 150. Then a mask and etch procedure is applied to etch through the central portion of first layer of silicon nitride 170a and through the central portion of the polysilicon material 150 to form an emitter window 160. The etch procedure stops on the layer of silicon oxide 140.

Then a second layer of silicon nitride 170b is placed over the first layer of silicon nitride 170a and over the layer of silicon oxide 140. The second layer of silicon nitride 170b covers the side walls of the emitter window 160. The first layer of silicon nitride 170a and the second layer of silicon nitride 170b merge to form a layer of silicon nitride (designated with reference numeral 170). The silicon nitride 170 forms a nitride spacer. Then an unmasked etch procedure is performed to etch the second layer of silicon nitride 170b down to the silicon oxide 140.

Then a diluted hydrofluoric acid (HF) etch procedure is applied to etch laterally through the layer of silicon oxide 140 to form a cavity 180. That is, the portions of the layer of silicon oxide 140 that are etched away are removed to form cavity 180. As will be described below, the cavity 180 will receive a layer of monocrystalline silicon to form a base structure over the NSEG collector 110. The resulting intermediate structure 100 is shown in FIG. 1.

Figure 2:
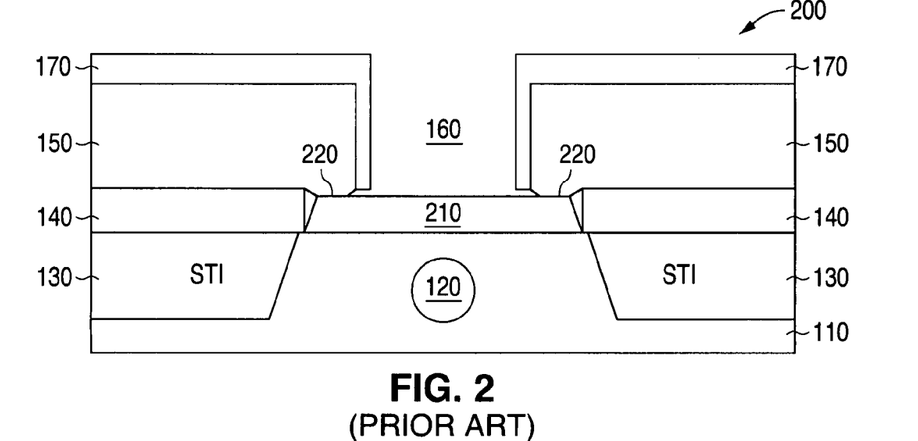
FIG. 2 illustrates a schematic diagram of a cross section of the intermediate structure shown in FIG. 1 after a selective epitaxial growth (SEG) base structure has been formed within the cavity of the transistor.

FIG. 2 illustrates a schematic diagram of a cross section of the intermediate structure 100 shown in FIG. 1 following the selective epitaxial growth (SEG) of a layer of monocrystalline silicon 210 in the cavity 180. The resulting intermediate structure is designated with reference numeral 200. As shown in FIG. 2, the top portions of the SEG monocrystalline silicon 210 grow upwardly and come in contact with downwardly growing portions of the polysilicon material 150. The contact surface of the two structures is designated with reference numeral 220 in FIG. 2.

It is very important that there be a contiguous connection between the polysilicon material 150 and the monocrystalline silicon 210 at the surface 220. A contiguous connection is required in order to minimize the magnitude of the base resistance. If there are gaps or other irregularities at the surface 220, there will be an undesirable increase in the magnitude of the base resistance.

It is also very important that there be a sufficient amount of boron diffusion from the highly doped polysilicon material 150 of the raised external base into the base-collector corner. A sufficient amount of boron diffusion is required in order to minimize the magnitude of the base-collector current. If there is an insufficient amount of boron diffusion into the base-collector corner, there will be an undesirable increase in the magnitude of the base-collector current. Ensuring that a sufficient amount of boron diffusion is present is particularly important for an advanced Bipolar-Complementary Metal Oxide Semiconductor (BiCMOS) process with a reduced rapid thermal anneal (RTA).

Prior art fully self aligned bipolar transistors sometimes do not have a completely contiguous connection at the surfaces between the polysilicon material of the raised external base and the monocrystalline silicon of the base. Prior art fully self aligned bipolar transistors sometimes do not allow a sufficient amount of boron to diffuse from the highly doped polysilicon material of the raised external base into the base-collector corner of the transistor.

Therefore, there is a need in the art for a system and method that is capable of solving the problems that occur when such prior art methods are utilized. In particular, there is a need in the art for a system and method for providing an efficient process that is capable of manufacturing a fully self aligned bipolar transistor that has a modified cavity formation that optimizes the selective epitaxial growth (SEG) of a monocrystalline silicon base of the transistor.

The method of the present invention solves the problems that are associated with the prior art by providing a cavity that has a shape that increases the likelihood that a contiguous connection will be formed at the surfaces between the polysilicon material of the raised external base and the monocrystalline silicon of the base. The method of the present invention also provides a cavity that has a shape that increases the likelihood that a sufficient amount of boron will be able to diffuse from the highly doped polysilicon material of the raised external base into the base-collector corner of the transistor.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 3 through 16, discussed below, and the various embodiments used to describe the principles of the present invention in this patent document are by way of illustration only and should not be construed in any way to limit the scope of the invention. Those skilled in the art will understand that the principles of the present invention may be implemented with any type of suitably arranged integrated circuit device.

The method of the present invention creates a cavity that has desirable features by using multiple layers of silicon oxide to form the walls of the cavity. Each layer of silicon oxide has a different wet etch rate with respect to a hydrofluoric acid (HF) wet etch process. This means that different amounts of the different layers of silicon oxide are removed by the hydrofluoric acid (HF) wet etch process when the cavity is formed. This feature enables the creation of a cavity that has a "stair step" wall geometry. Consider, for example, the three advantageous embodiments of the method of the present invention described below.

Figure 3:
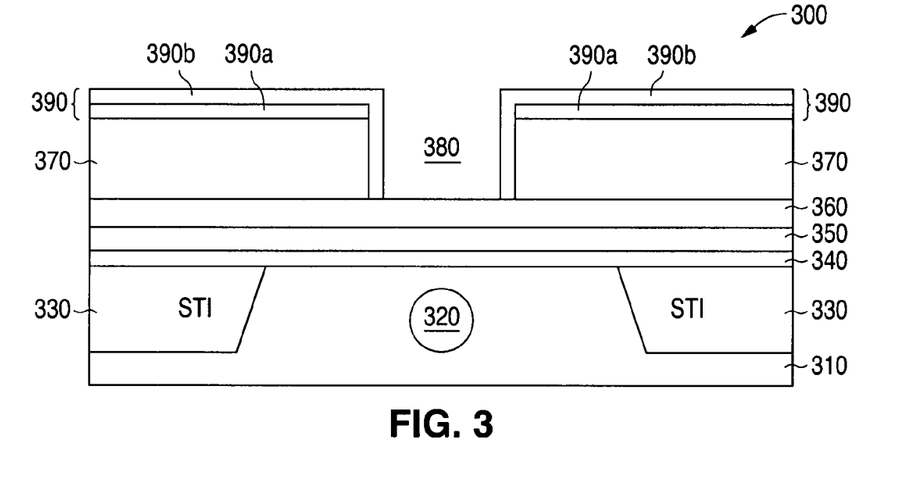
FIGS. 3 through 5 illustrate successive key steps in the formation of a first embodiment of a fully self aligned bipolar transistor of the present invention that has a modified cavity formation that optimizes the selective epitaxial growth (SEG) of the monocrystalline silicon base of the transistor.
Figure 4:
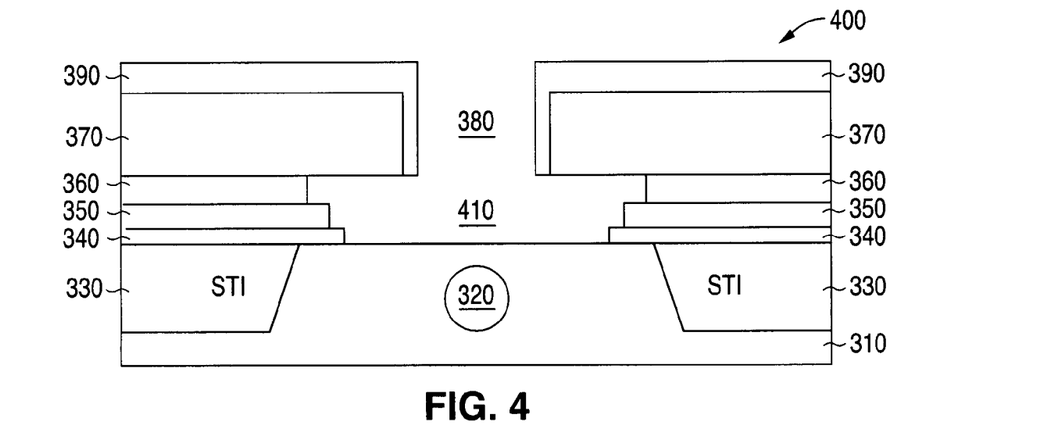
Figure 5:
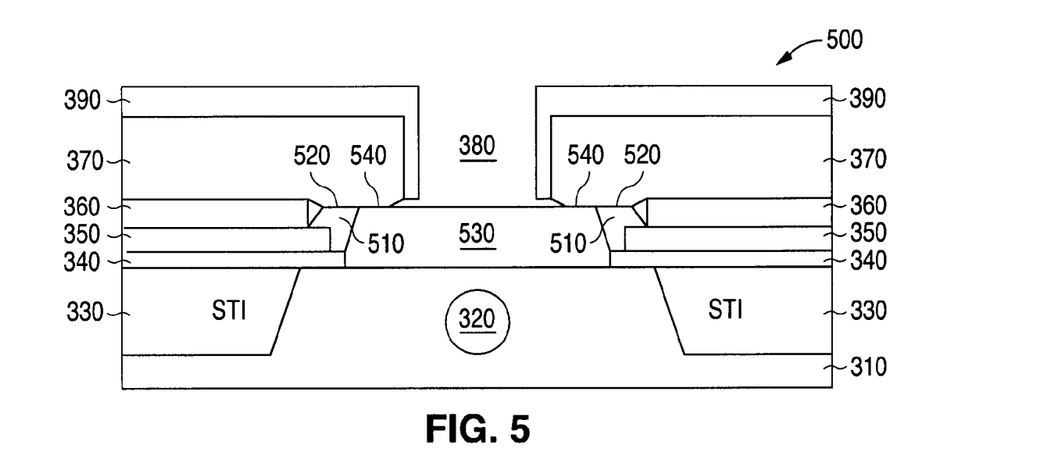

FIGS. 3 through 5 illustrate successive key steps in the formation of a first advantageous embodiment of a fully self aligned bipolar transistor of the present invention that has a modified cavity formation that optimizes the selective epitaxial growth (SEG) of the monocrystalline silicon base of the transistor. To simplify the drawings the reference numerals from previous drawings will sometimes not be repeated for structures that have already been identified. For purposes of clarity of illustration the thickness of the structures will sometimes not be drawn to scale.

The structure 300 shown in FIG. 3 comprises a Non-Selective Epitaxial Growth (NSEG) collector 310 and a selective implanted collector (SIC) 320 located within a central portion of the NSEG collector 310. The central portion of the NSEG collector 310 is located between two shallow trench isolation (STI) structures 330. During the manufacture of the structure 300 shown in FIG. 3, a layer of first silicon oxide 340 (e.g., thermal silicon oxide 340 from a typical BiCMOS gate oxide) is placed over the NSEG collector 310 and over the STI structures 330. In one advantageous embodiment of the method of the invention, a thickness of the first silicon oxide 340 is approximately ten nanometers (10 nm).

Then a layer of second silicon oxide 350 (e.g., high density plasma (HDP) oxide 350) is placed over the layer of first silicon oxide 340. In one advantageous embodiment of the method of the invention, a thickness of the second silicon oxide 350 is approximately twenty nanometers (20 nm).

Then a layer of third silicon oxide 360 (e.g., tetraethyloxysilane 360) is placed over the layer of second silicon oxide 350. In one advantageous embodiment of the method of the invention, a thickness of the third silicon oxide 360 is approximately thirty nanometers (30 nm). These values of thickness for the first, second and third silicon oxide layers are illustrative. It is understood that other values of thickness for these three layers could be used to practice the method of the invention.

Then a layer of in-situ doped polysilicon material 370 is placed over the layer of third silicon oxide 360 to form a raised external base. Then a first layer of silicon nitride 390a is formed over the polysilicon material 370. Then a mask and etch procedure is applied to etch through the central portion of first layer of silicon nitride 390a and through the central portion of the polysilicon material 370 to form an emitter window 380. The etch procedure stops on the layer of third silicon oxide 360.

Then a second layer of silicon nitride 390b is placed over the first layer of silicon nitride 390a and over the layer of third silicon oxide 360. The second layer of silicon nitride 390b covers the side walls of the emitter window 380. The first layer of silicon nitride 390a and the second layer of silicon nitride 390b merge to form a layer of silicon nitride (designated with reference numeral 390). The silicon nitride 390 forms a nitride spacer. Then an unmasked etch procedure is performed to etch the second layer of silicon nitride 390b down to the third silicon oxide 360.

Then a diluted hydrofluoric acid (HF) etch procedure is applied to etch through the third silicon oxide 360, through the second silicon oxide 350 and through the first silicon oxide 340 down to the NSEG collector 310. The etch procedure etches laterally through the three layers of silicon oxide (340, 350, 360) to form cavity 410. That is, the portions of the three silicon oxide layers that are etched away are removed to form cavity 410. The result of applying the diluted hydrofluoric acid (HF) etch procedure is shown in the structure 400 shown in FIG. 4. As will be described below, the cavity 410 will receive a layer of monocrystalline silicon to form a base structure over the NSEG collector 310.

As shown in FIG. 4, the walls of the cavity 410 have a "stair step" geometry. This is due to the fact that the three silicon oxide layers (340, 350, 360) each have a different wet etch rate with respect to the diluted hydrofluoric acid (HF) etch procedure. The first silicon oxide layer 340 (thermal oxide 340 in this example) has the slowest wet etch rate and therefore less of its material is removed. The second silicon oxide layer 350 (high density plasma oxide 350 in this example) has an intermediate wet etch rate and therefore more of its material is removed during the time of application of the diluted hydrofluoric acid (HF) etch procedure.

The third silicon oxide layer 360 (tetraethyloxysilane 360 in this example) has the fastest wet etch rate of the three layers of silicon oxide and therefore even more of its material is removed during the time of application of the diluted hydrofluoric acid (HF) etch procedure. The differing wet etch rates of the three layers of silicon oxide cause the walls of the cavity 410 to have the "stair step" geometry that is shown in FIG. 4.

Generally, by carefully selecting the types of silicon oxide materials for the composition of the walls of the cavity 410 and by controlling the duration time of the application of the diluted hydrofluoric acid (HF) etch process, it is possible to optimize the dimensions of the walls of the cavity 410. That is, the walls of the cavity 410 may be designed and manufactured to have a desirable profile.

Then a selective epitaxial growth (SEG) procedure is applied to grow a polysilicon rich corner 510 on the "stair step" walls of the cavity 410. The polysilicon rich corner 510 is shown in FIG. 5. The polysilicon rich corner 510 is grown upwardly from the "stair" of the first silicon oxide 340 and the "stair" of the second silicon oxide 350. The top of the polysilicon rich corner 510 meets the downwardly growing polysilicon 370 of the raised extrinsic base at the surfaces 520.

A selective epitaxial growth (SEG) procedure is applied to grow a monocrystalline silicon base 530 on the NSEG collector 310. The top of the monocrystalline silicon base 530 meets the downwardly growing polysilicon 370 of the raised extrinsic base at the surfaces 540. The result of applying these selective epitaxial growth (SEG) procedures is shown in the structure 500 shown in FIG. 5.

Figure 6:
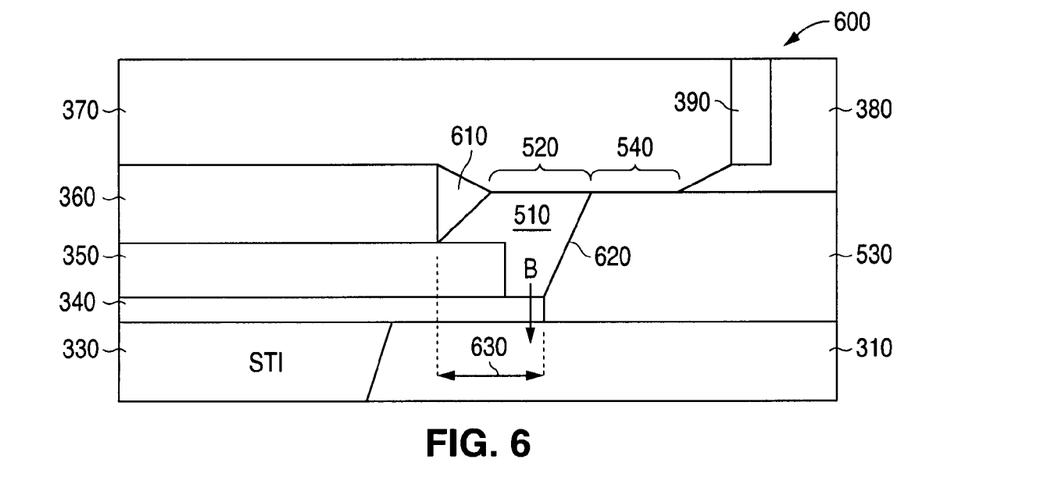
FIG. 6 illustrates a detailed view of a first embodiment of a polysilicon rich corner of the present invention and its location within the transistor.

FIG. 6 illustrates a detailed view of a first embodiment of the polysilicon rich corner 510 of the present invention. As shown in FIG. 6, the top of the polysilicon rich corner 510 is contiguous with the bottom of the polysilicon 370 of the raised extrinsic base at the surface 520. The bottom of the polysilicon rich corner 510 is in contact with and rests upon the "stairs" of the first silicon oxide 340 and the second silicon oxide 350. There is a triangularly shaped void 610 between a first side of the polysilicon rich corner 510 and the vertical wall of the third silicon oxide 360. The second side of the polysilicon rich corner 510 is in contact with the SEG monocrystalline silicon base 530 at the surface 620.

The length that is designated by reference numeral 630 in FIG. 6 represents a reduction in the base-collector area that is provided by the present invention. Reducing the base-collector area is desirable because it reduces the base-collector capacitance in the transistor.

The polysilicon rich corner 510 provides an excellent linking from the intrinsic base 530 (SEG monocrystalline silicon base 530) to the extrinsic base 370 (polysilicon 370). The linking is through the surface 620 from the intrinsic base 530 to the polysilicon rich corner 510 and through the surface 520 from the polysilicon rich corner 510 to the extrinsic base 370.

The polysilicon rich corner 510 also provides a faster rate of boron diffusion into the base-collector corner when compared to the boron diffusion rate of prior art transistors. The diffusion of boron is represented in FIG. 6 by an arrow that is labeled with the letter B.

The polysilicon rich corner 510 of present invention provides significant improvements over the prior art. In summary, the improvements are (1) reduction in the base-collector area that reduces base-collector capacitance, (2) excellent linking from the intrinsic base 530 to the extrinsic base 370, and (3) faster rate of boron diffusion into the base-collector corner.

Figure 7:
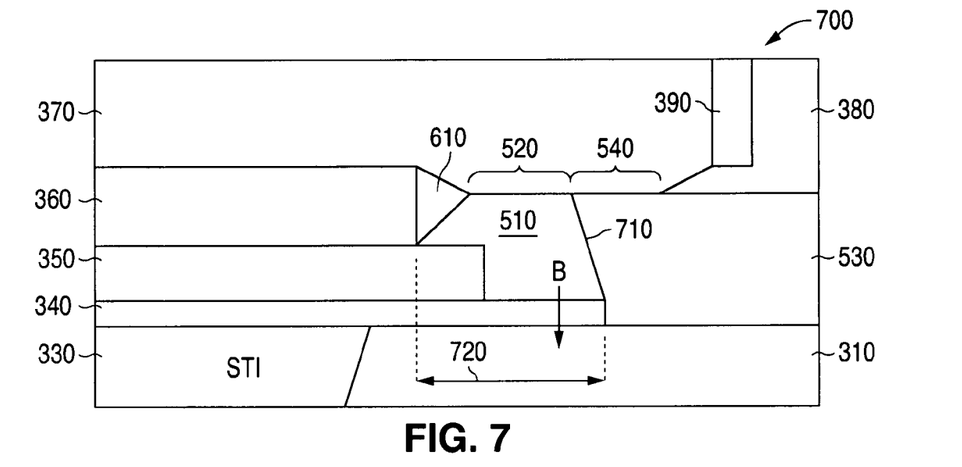
FIG. 7 illustrates a detailed view of a second embodiment of a polysilicon rich corner of the present invention and its location within the transistor.

By carefully controlling the selective epitaxial growth (SEG) on the "stair step" geometry of the silicon oxide layers and on the surface of the NSEG collector 310, the growth planes of the polysilicon rich corner 510 and the monocrystalline silicon base 530 can be tuned to increase the layer stability. This feature is illustrated in FIG. 7.

Less of the material of the first silicon oxide 340 is removed during the hydrofluoric acid (HF) etch procedure. This results in the formation of a longer "stair step" over the NSEG collector 310. This causes the surface 710 between the polysilicon rich corner 510 and the intrinsic base 530 to have a different angle as shown in FIG. 7. This also increases the length 730 (as compared to length 630) that represents a reduction in the base-collector area. Better stability is accomplished by locating the surface 710 away from the intrinsic active area.

Figure 8:
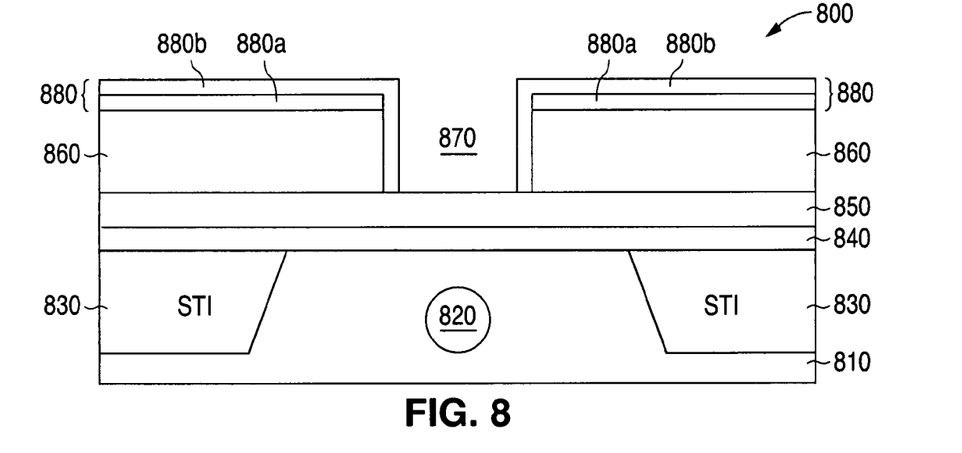
FIGS. 8 through 10 illustrate successive key steps in the formation of a second embodiment of a fully self aligned bipolar transistor of the present invention that has a modified cavity formation that optimizes the selective epitaxial growth (SEG) of the monocrystalline silicon base of the transistor.
Figure 9:
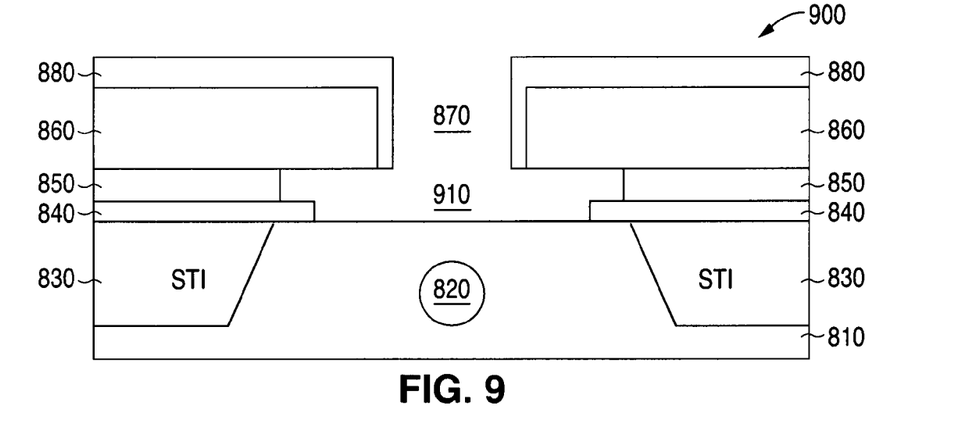
Figure 10:
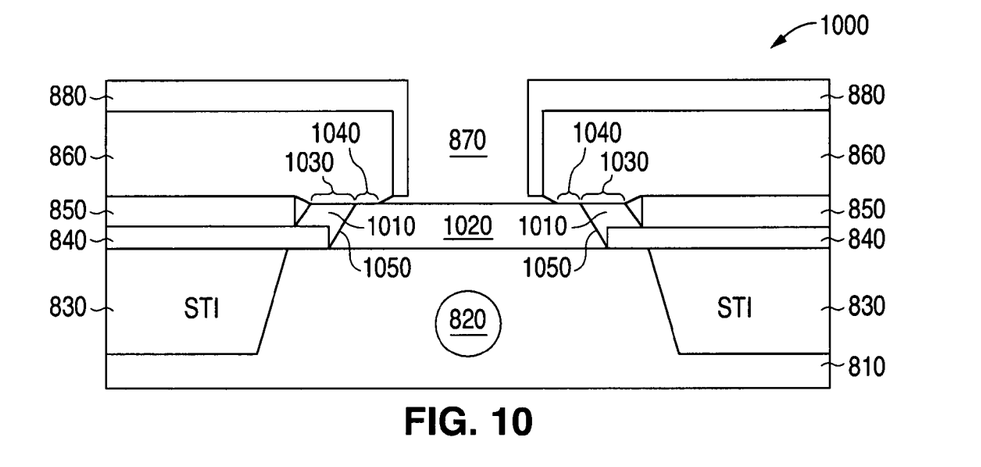

FIGS. 8 through 10 illustrate successive key steps in the formation of a second embodiment of a fully self aligned bipolar transistor of the present invention that has a modified cavity formation that optimizes the selective epitaxial growth (SEG) of the monocrystalline silicon base of the transistor. In the second embodiment two layers of silicon oxide are used instead of three layers.

The structure 800 shown in FIG. 8 comprises a Non-Selective Epitaxial Growth (NSEG) collector 810 and a selective implanted collector (SIC) 820 located within a central portion of the NSEG collector 810. The central portion of the NSEG collector 810 is located between two shallow trench isolation (STI) structures 830. During the manufacture of the structure 800 shown in FIG. 8, a layer of first silicon oxide 840 (e.g., high density plasma silicon oxide 840) is placed over the placed over the NSEG collector 810 and over the STI structures 830. In one advantageous embodiment of the method of the invention, a thickness of the first silicon oxide 840 is approximately thirty nanometers (30 nm).

Then a layer of second silicon oxide 850 (e.g., tetraethyloxysilane 850) is placed over the layer of first silicon oxide 840. In one advantageous embodiment of the method of the invention, a thickness of the second silicon oxide 850 is approximately thirty nanometers (30 nm). These values of thickness for the first and second silicon oxide layers are illustrative. It is understood that other values of thickness for these two layers could be used to practice the method of the invention.

Then a layer of in-situ doped polysilicon material 860 is placed over the layer of second silicon oxide 850 to form a raised external base. Then a first layer of silicon nitride 880a is formed over the polysilicon material 860. Then a mask and etch procedure is applied to etch through the central portion of first layer of silicon nitride 880a and through the central portion of the polysilicon material 860 to form an emitter window 870. The etch procedure stops on the layer of second silicon oxide 850.

Then a second layer of silicon nitride 880*b* is placed over the first layer of silicon nitride 880*a* and over the layer of second silicon oxide 850. The second layer of silicon nitride 880*b* covers the side walls of the emitter window 870. The first layer of silicon nitride 880*a* and the second layer of silicon nitride 880*b* merge to form a layer of silicon nitride (designated with reference numeral 880). The silicon nitride 880 forms a nitride spacer. Then an unmasked etch procedure is performed to etch the second layer of silicon nitride 880*b* down to the second silicon oxide 850.

Then a diluted hydrofluoric acid (HF) etch procedure is applied to etch through the second silicon oxide 850 and through the first silicon oxide 840 down to the NSEG collector 810. The etch procedure etches laterally through the two layers of silicon oxide (840 and 850) to form cavity 910. That is, the portions of the two silicon oxide layers that are etched away are removed to form cavity 910. The result of applying the diluted hydrofluoric acid (HF) etch procedure is shown in the structure 900 shown in FIG. 9. As will be described below, the cavity 910 will receive a layer of monocrystalline silicon to form a base structure over the NSEG collector 810.

As shown in FIG. 9, the walls of the cavity 910 have a "stair step" geometry. This is due to the fact that the two silicon oxide layers (840 and 850) each have a different wet etch rate with respect to the diluted hydrofluoric acid (HF) etch procedure. The first silicon oxide layer 840 (high density plasma silicon oxide 840 in this example) has a slower wet etch rate than the second silicon oxide layer 850 (tetraethyloxysilane 850 in this example). Therefore less of the material of the first silicon oxide layer 840 is removed during the time of application of the diluted hydrofluoric acid (HF) etch procedure. The differing wet etch rates of the two layers of silicon oxide cause the walls of the cavity 910 to have the "stair step" geometry that is shown in FIG. 9. That is, the top portion of the cavity 910 is wider than the bottom portion of the cavity 910.

Then a selective epitaxial growth (SEG) procedure is applied to grow a polysilicon rich corner 1010 on the "stair step" walls of the cavity 910. The polysilicon rich corner 1010 is shown in FIG. 10. The polysilicon rich corner 1010 is grown upwardly from the "stair" of the first silicon oxide 840. As in the case of the first embodiment previously described, the top of the polysilicon rich corner 1010 meets the downwardly growing polysilicon 860 of the raised extrinsic base at the surfaces 1030.

A selective epitaxial growth (SEG) procedure is applied to grow a monocrystalline silicon base 1020 within the cavity 910 on the surface of the NSEG collector 810. Also as in the case of the first embodiment previously described, the top of the monocrystalline silicon base 1020 meets the downwardly growing polysilicon 860 of the raised extrinsic base at the surfaces 1040. The surfaces between the polysilicon rich corners 1010 and the monocrystalline silicon base 1020 are designated with the reference numerals 1050. The result of applying these selective epitaxial growth (SEG) procedures is shown in the structure 1000 shown in FIG. 10.

The second embodiment of the present invention operates in the same manner as the first embodiment except that the wall geometry of the cavity 910 is formed with two layers of silicon oxide instead of with three layers.

Figure 11:
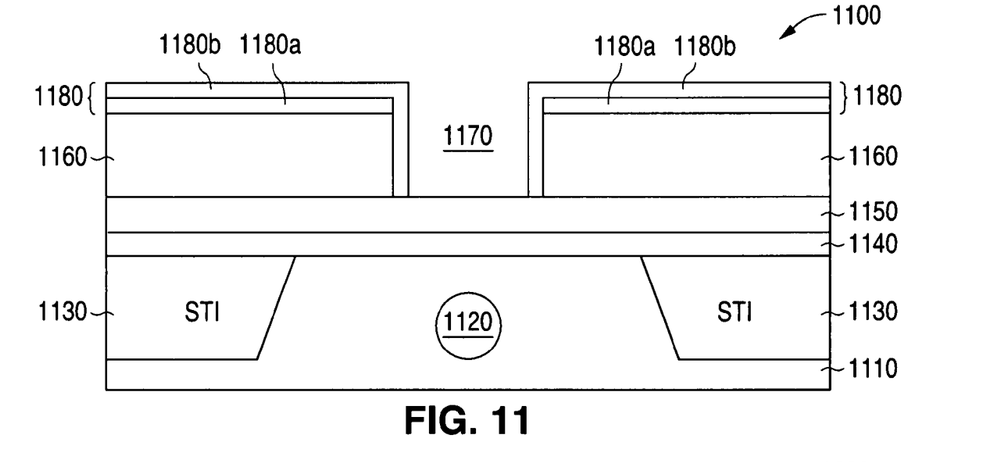
FIGS. 11 through 13 illustrate successive key steps in the formation of a third embodiment of a fully self aligned bipolar transistor of the present invention that has a modified cavity formation that optimizes the selective epitaxial growth (SEG) of the monocrystalline silicon base of the transistor.
Figure 12:
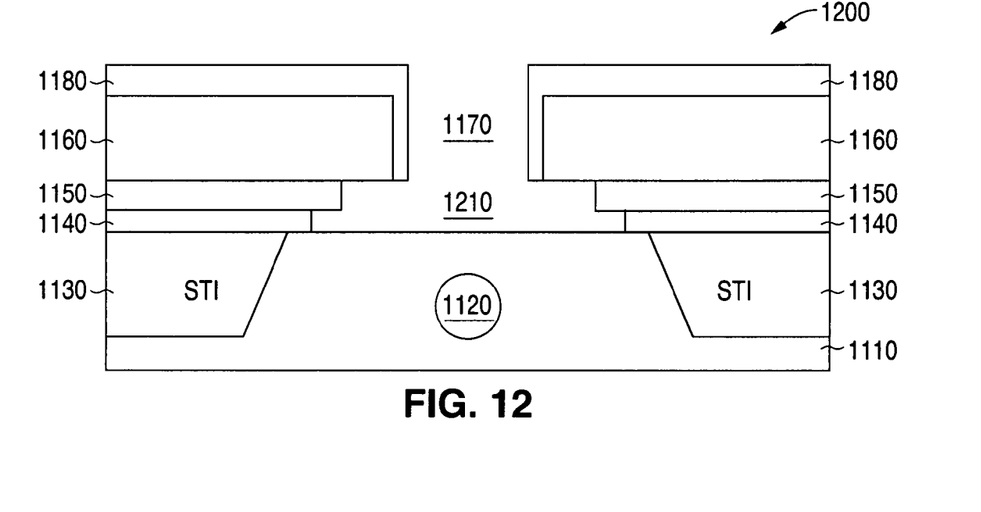
Figure 13:
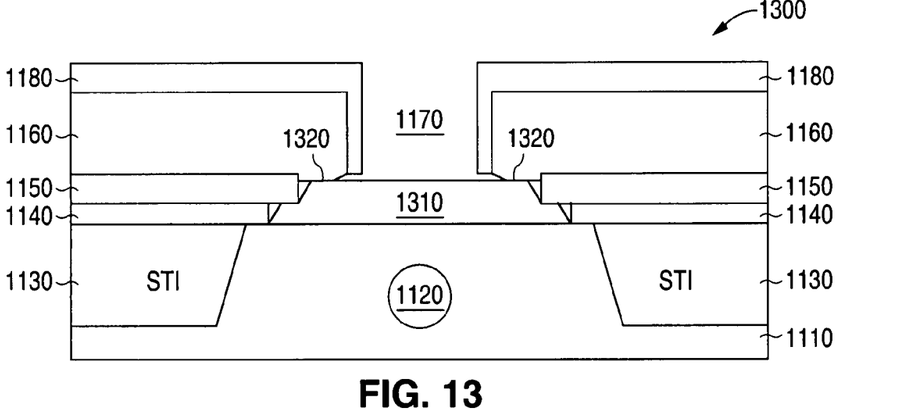

FIGS. 11 through 13 illustrate successive key steps in the formation of a third embodiment of a fully self aligned bipolar transistor of the present invention that has a modified cavity formation that optimizes the selective epitaxial growth (SEG) of the monocrystalline silicon base of the transistor. In the third embodiment two layers of silicon oxide are used instead of three layers. In addition, the order of the two layers is reversed compared to the order of the two layers in the second embodiment. The reversal of the order of the two layers in the third embodiment leads to the formation of a cavity with a different wall geometry than that of the cavity 910 of the second embodiment.

The structure 1100 shown in FIG. 11 comprises a Non-Selective Epitaxial Growth (NSEG) collector 1110 and a selective implanted collector (SIC) 1120 located within a central portion of the NSEG collector 1110. The central portion of the NSEG collector 1110 is located between two shallow trench isolation (STI) structures 1130. During the manufacture of the structure 1100 shown in FIG. 11, a layer of first silicon oxide 1140 (e.g., tetraethyloxysilane 1140) is placed over the placed over the NSEG collector 1110 and over the STI structures 1130. In one advantageous embodiment of the method of the invention, a thickness of the first silicon oxide 1140 is approximately thirty nanometers (30 nm).

Then a layer of second silicon oxide 1150 (e.g., high density plasma silicon oxide 1150) is placed over the layer of first silicon oxide 1140. In one advantageous embodiment of the method of the invention, a thickness of the second silicon oxide 1150 is approximately thirty nanometers (30 nm). These values of thickness for the first and second silicon oxide layers are illustrative. It is understood that other values of thickness for these two layers could be used to practice the method of the invention.

Then a layer of in-situ doped polysilicon material 1160 is placed over the layer of second silicon oxide 1150 to form a raised external base. Then a first layer of silicon nitride 1180*a* is formed over the polysilicon material 1160. Then a mask and etch procedure is applied to etch through the central portion of first layer of silicon nitride 1180*a* and through the central portion of the polysilicon material 1160 to form an emitter window 1170. The etch procedure stops on the layer of second silicon oxide 1150.

Then a second layer of silicon nitride 1180*b* is placed over the first layer of silicon nitride 1180*a* and over the layer of second silicon oxide 1150. The second layer of silicon nitride 1180*b* covers the side walls of the emitter window 1170. The first layer of silicon nitride 1180*a* and the second layer of silicon nitride 1180*b* merge to form a layer of silicon nitride (designated with reference numeral 1180). The silicon nitride 1180 forms a nitride spacer. Then an unmasked etch procedure is performed to etch the second layer of silicon nitride 1180*b* down to the second silicon oxide 1150.

Then a diluted hydrofluoric acid (HF) etch procedure is applied to etch through the second silicon oxide 1150 and through the first silicon oxide 1140 down to the NSEG collector 1110. The etch procedure etches laterally through the two layers of silicon oxide (1150 and 1140) to form cavity 1210. That is, the portions of the two silicon oxide layers that are etched away are removed to form cavity 1210. The result of applying the diluted hydrofluoric acid (HF) etch procedure is shown in the structure 1200 shown in FIG. 12. As will be described below, the cavity 1210 will receive a layer of monocrystalline silicon to form a base structure over the NSEG collector 1110.

As shown in FIG. 12, the walls of the cavity 910 have a "reverse stair step" geometry. This is due to the fact that the two silicon oxide layers (1140 and 1150) each have a different wet etch rate with respect to the diluted hydrofluoric acid (HF) etch procedure. The first silicon oxide layer 1140 (tetraethyloxysilane 1140 in this example) has a faster wet etch rate than the second silicon oxide layer 1150 (high density plasma silicon oxide 1150 in this example). Therefore more of the material of the first silicon oxide layer 1140 is removed during the time of application of the diluted hydrofluoric acid (HF) etch procedure. The differing wet etch rates of the two layers of silicon oxide cause the walls of the cavity 1210 to have the "reverse stair step" geometry that is shown in FIG. 12. That is, the bottom portion of the cavity 1210 is wider than the top portion of the cavity 1210.

Then a selective epitaxial growth (SEG) procedure is applied to grow a monocrystalline silicon base 1310 adjacent to the "reverse stair step" walls of the cavity 1210. The monocrystalline silicon base 1310 is shown in FIG. 13. The monocrystalline silicon base 1310 is grown upwardly from NSEG collector 1110. The top of the monocrystalline silicon base 1310 meets the downwardly growing polysilicon 1160 of the raised extrinsic base at the surfaces 1320. The result of applying the selective epitaxial growth (SEG) procedure is shown in the structure 1300 shown in FIG. 13.

The selective epitaxial growth (SEG) procedure described in the third embodiment of the present invention can be controlled to enhance the layer stability at the base-collector corner. However, this third embodiment loses some of the advantages of the first embodiment such as the reduction in the base-collector capacitance.

Figure 14:
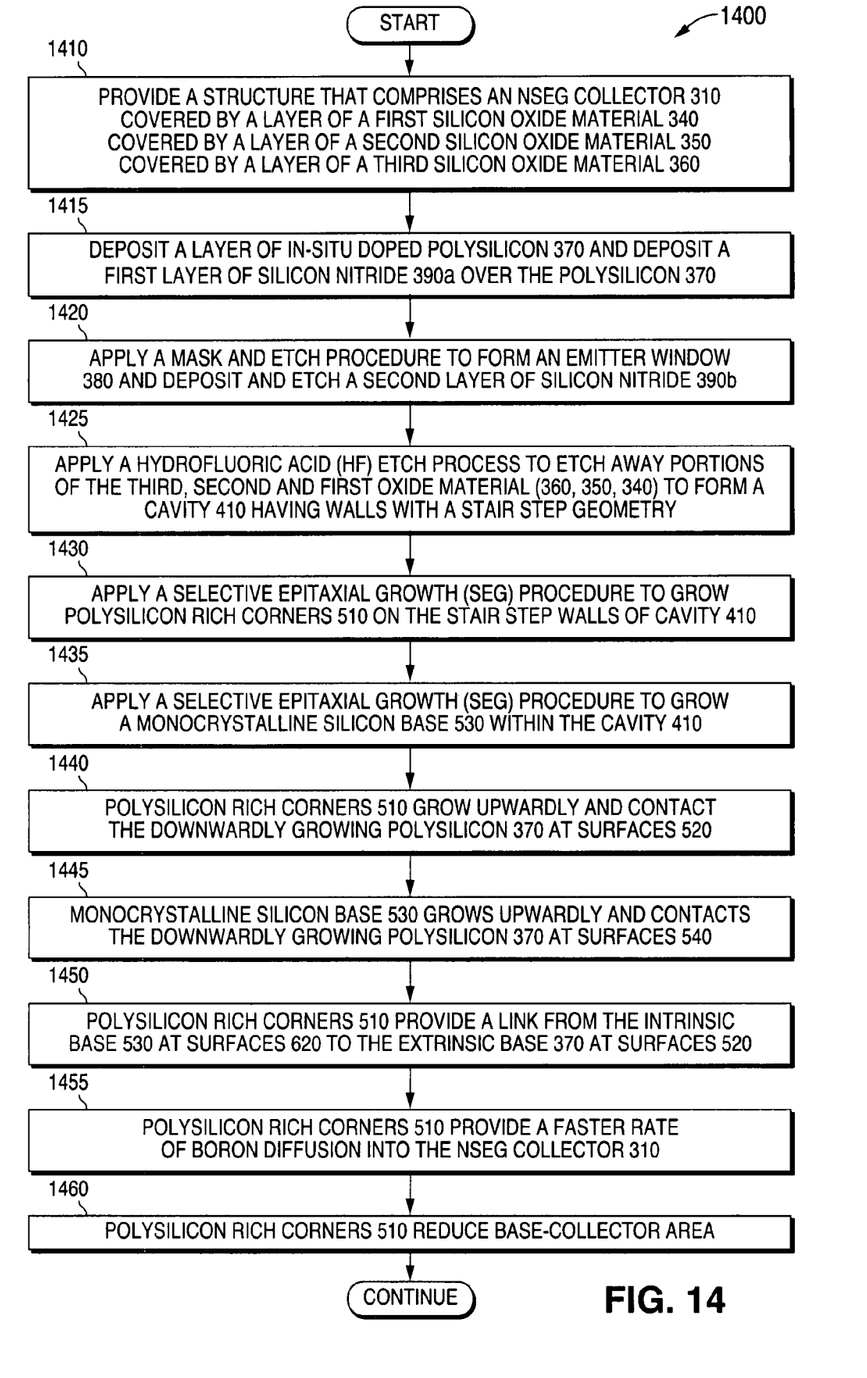
FIG. 14 illustrates a flow chart showing the steps of a first advantageous embodiment of a method of the present invention.

FIG. 14 illustrates a flow chart 1400 showing the steps of a first advantageous embodiment of a method of the present invention. In the first step of the method a structure is provided that comprises an NSEG collector 310 covered by a layer of first silicon oxide material 340 covered by a layer of second silicon oxide material 350 covered by a layer of third silicon oxide material 360 (step 1410).

Then a layer of in-situ doped polysilicon 370 is deposited and a first layer of silicon nitride 390*a* is deposited over the polysilicon 370 (step 1415). Then the first layer of silicon nitride 390*a* and the polysilicon 370 are masked and etched to form an emitter window 380. A second layer of silicon nitride 390*b* is deposited and etched to form a nitride spacer on the walls of the emitter window 380 (step 1420).

Then a hydrofluoric acid (HF) etch procedure is applied to etch away portions of the third silicon oxide layer 360, the second silicon oxide layer 350, and the first silicon oxide layer 340 to form a cavity 410 having walls with a "stair step" geometry (step 1425). The "stair step" geometry of the walls of cavity 410 is due to the differing wet etch rates of the three layers of silicon oxide.

Then a selective epitaxial growth (SEG) procedure is applied to grow polysilicon rich corners 510 on the "stair step" walls of cavity 410 (step 1430). Then a selective epitaxial growth (SEG) procedure is applied to grow a monocrystalline silicon base 530 within the cavity 410 (step 1435).

The polysilicon rich corners 510 grow upwardly and contact the downwardly growing polysilicon 370 at the surfaces 520 (step 1440). The monocrystalline silicon base 530 grows upwardly and contacts the downwardly growing polysilicon 370 at the surfaces 540 (step 1445). The polysilicon rich corners 510 provide a link from the intrinsic base 530 at the surfaces 620 to the extrinsic base 370 at the surfaces 520 (step 1450).

The polysilicon rich corners 510 provide a faster rate of boron diffusion into the NSEG collector 310 (step 1455). The polysilicon rich corners 510 also reduce the base-collector area (step 1460).

Figure 15:
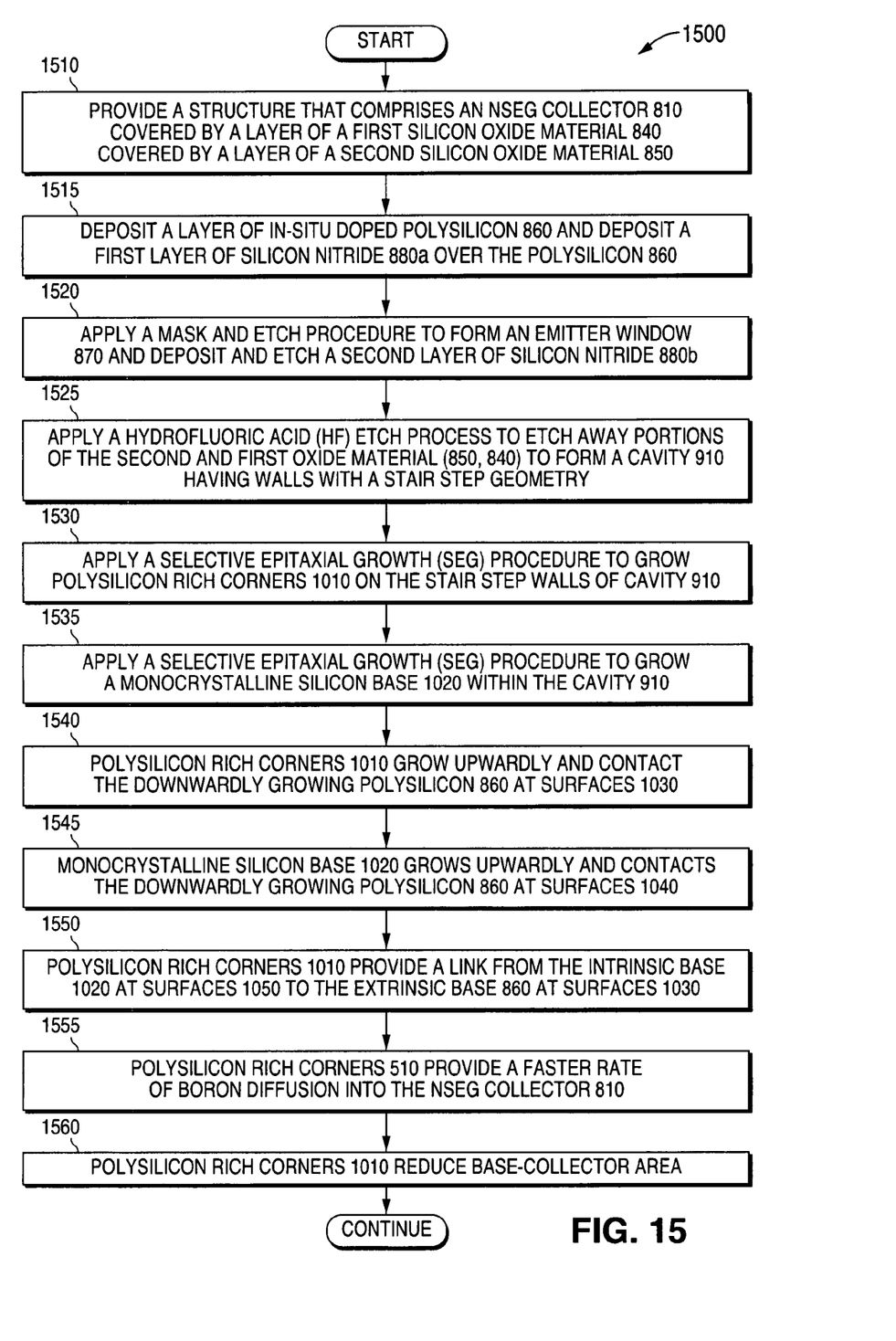
FIG. 15 illustrates a flow chart showing the steps of a second advantageous embodiment of a method of the present invention.

FIG. 15 illustrates a flow chart 1500 showing the steps of a second advantageous embodiment of a method of the present invention. In the first step of the method a structure is provided that comprises an NSEG collector 810 covered by a layer of first silicon oxide material 840 covered by a layer of second silicon oxide material 850 (step 1510).

Then a layer of in-situ doped polysilicon 860 is deposited and a first layer of silicon nitride 880*a* is deposited over the polysilicon 860 (step 1515). Then the first layer of silicon nitride 880*a* and the polysilicon 860 are masked and etched to form an emitter window 870. A second layer of silicon nitride 880*b* is deposited and etched to form a nitride spacer on the walls of the emitter window 870 (step 1520).

Then a hydrofluoric acid (HF) etch procedure is applied to etch away portions of the second silicon oxide layer 850 and the first silicon oxide layer 840 to form a cavity 910 having walls with a "stair step" geometry (step 1525). The "stair step" geometry of the walls of cavity 910 is due to the differing wet etch rates of the two layers of silicon oxide.

Then a selective epitaxial growth (SEG) procedure is applied to grow polysilicon rich corners 1010 on the "stair step" walls of cavity 910 (step 1530). Then a selective epitaxial growth (SEG) procedure is applied to grow a monocrystalline silicon base 1020 within the cavity 910 (step 1535).

The polysilicon rich corners 1010 grow upwardly and contact the downwardly growing polysilicon 860 at the surfaces 1030 (step 1540). The monocrystalline silicon base 1020 grows upwardly and contacts the downwardly growing polysilicon 860 at the surfaces 1040 (step 1545). The polysilicon rich corners 1010 provide a link from the intrinsic base 1020 at the surfaces 1050 to the extrinsic base 860 at the surfaces 1030 (step 1550).

The polysilicon rich corners 1010 provide a faster rate of boron diffusion into the NSEG collector 810 (step 1555). The polysilicon rich corners 1010 also reduce the base-collector area (step 1560).

Figure 16:
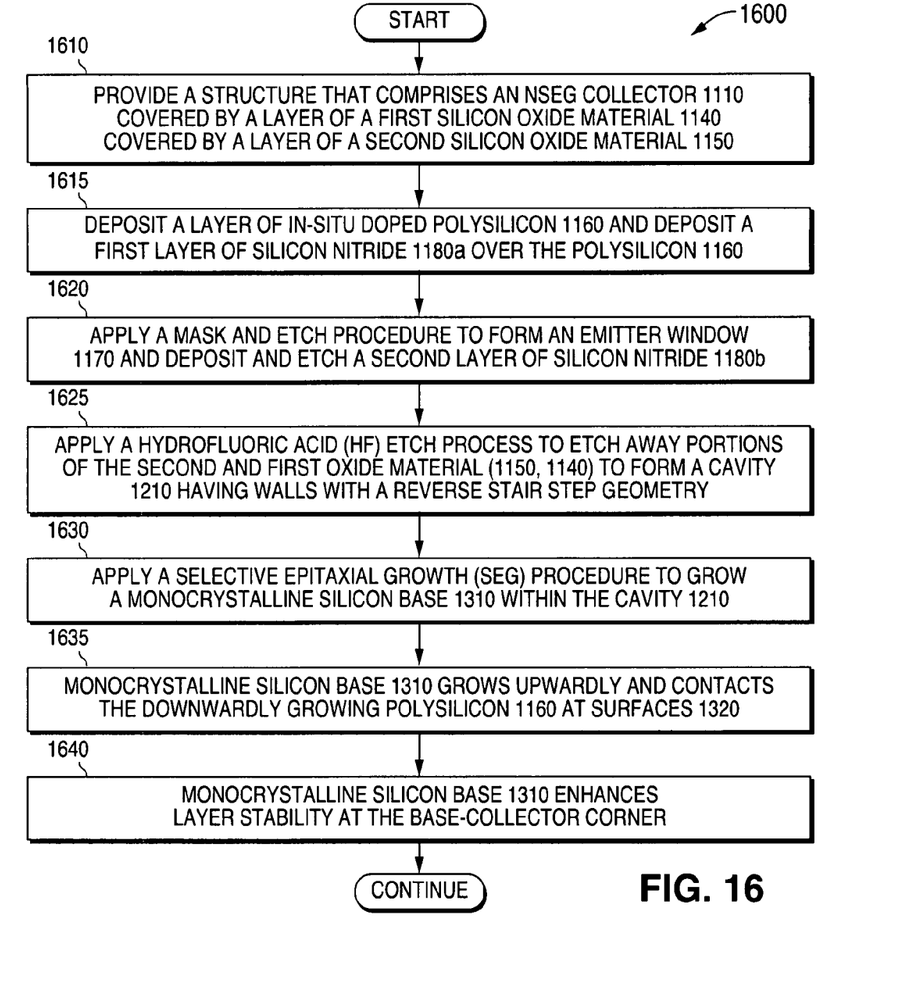
FIG. 16 illustrates a flow chart showing the steps of a third advantageous embodiment of a method of the present invention.

FIG. 16 illustrates a flow chart 1600 showing the steps of a third advantageous embodiment of a method of the present invention. In the first step of the method a structure is provided that comprises an NSEG collector 1110 covered by a layer of first silicon oxide material 1140 covered by a layer of second silicon oxide material 1150 (step 1610).

Then a layer of in-situ doped polysilicon 1160 is deposited and a first layer of silicon nitride 1180*a* is deposited over the polysilicon 1160 (step 1615). Then the first layer of silicon nitride 1180*a* and the polysilicon 1160 are masked and etched to form an emitter window 1170. A second layer of silicon nitride 1180*b* is deposited and etched to form a nitride spacer on the walls of the emitter window 1170 (step 1620).

Then a hydrofluoric acid (HF) etch procedure is applied to etch away portions of the second silicon oxide layer 1150 and the first silicon oxide layer 1140 to form a cavity 1210 having walls with a "reverse stair step" geometry (step 1625). The "reverse stair step" geometry of the walls of cavity 1210 is due to the differing wet etch rates of the two layers of silicon oxide.

Then a selective epitaxial growth (SEG) procedure is applied to grow a monocrystalline silicon base 1310 within the cavity 1210 (step 1630). The monocrystalline silicon base 1310 grows upwardly and contacts the downwardly growing polysilicon 1160 at the surfaces 1320 (step 1635). The monocrystalline silicon base 1310 enhances layer stability at the base-collector corner (step 1640).

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. A method of manufacturing a self aligned bipolar transistor comprising the steps of:
    forming a collector in an active region of the transistor to be formed;
    forming at least three layers of silicon oxide above the collector; and
    forming a cavity within the at least three layers of silicon oxide, the cavity having a cavity wall that comprises at least three different lengths of the at least three layers of silicon oxide.

2. The method as claimed in claim 1 wherein the step of forming the cavity comprises the step of:
    removing portions of the at least three layers of silicon oxide above the collector using a wet etch process.

3. The method as claimed in claim 2 wherein each of the at least three layers of silicon oxide has a different wet etch rate with respect to the wet etch process.

4. The method as claimed in claim 2 wherein the wet etch process is a hydrofluoric acid wet etch process.

5. The method as claimed in claim 1 wherein the at least three layers of silicon oxide comprise a layer of thermal silicon oxide, a layer of high density plasma oxide, and a layer of tetraethyloxysilane.

6. The method as claimed in claim 1 wherein the cavity wall forms one of: a stair step geometry and a reverse stair step geometry.

7. The method as claimed in claim 1 further comprising the steps of:
    forming a polysilicon raised external base having portions that extend over the cavity;
    forming a polysilicon rich corner within the cavity under the portions of the polysilicon raised external base that extend over the cavity; and
    forming a monocrystalline silicon base within the cavity adjacent to the polysilicon rich corner.

8. A method of manufacturing a self aligned bipolar transistor comprising the steps of:
    forming a collector in an active region of the transistor to be formed;
    forming at least three layers of silicon oxide above the collector;
    forming a polysilicon raised external base on a top layer of the at least three layers of silicon oxide;
    forming an emitter window through the polysilicon raised external base down to the top layer of silicon oxide; and
    forming a cavity within the at least three layers of silicon oxide, the cavity having a cavity wall that comprises at least three different lengths of the at least three layers of silicon oxide.

9. The method as claimed in claim 8 wherein the step of forming the cavity comprises the step of:
    performing a wet etch process through the emitter window to remove portions of the at least three layers of silicon oxide layer to form the cavity over the collector.

10. The method as claimed in claim 9 wherein each of the at least three layers of silicon oxide has a different wet etch rate with respect to the wet etch process.

11. The method as claimed in claim 9 wherein the wet etch process is a hydrofluoric acid wet etch process.

12. The method as claimed in claim 8 wherein the at least three layers of silicon oxide comprise a layer of thermal silicon oxide, a layer of high density plasma oxide, and a layer of tetraethyloxysilane.

13. The method as claimed in claim 12 wherein the cavity wall forms one of: a stair step geometry and a reverse stair step geometry.

14. The method as claimed in claim 8 further comprising the steps of:
    applying a selective epitaxial growth procedure to form a polysilicon rich corner within the cavity under portions of the polysilicon raised external base that extend over the cavity; and
    applying a selective epitaxial growth procedure to form a monocrystalline silicon base within the cavity adjacent to the polysilicon rich corner.

15. The method as claimed in claim 14 further comprising the steps of:
    growing the polysilicon rich corner upwardly so that it contacts downwardly growing portions of the polysilicon raised external base;
    growing the monocrystalline silicon base upwardly so that it contacts the downwardly growing portions of the polysilicon raised external base; and
    forming a link from the monocrystalline silicon base to the polysilicon raised external base through the polysilicon rich corner.

16. The method as claimed in claim 14 further comprising the steps of:
    providing an increased rate of boron diffusion from the polysilicon rich corner to the collector of the transistor; and
    reducing a base-collector capacitance by reducing an area of contact between the base and the collector of the transistor.

17. A method of manufacturing a self aligned bipolar transistor comprising the steps of:
    forming a collector in an active region of the transistor to be formed;
    forming a first layer of silicon oxide above the collector;
    forming a second layer of silicon oxide above the first layer of silicon oxide;
    forming a third layer of silicon oxide above the second layer of silicon oxide;
    forming a polysilicon raised external base on the third layer of silicon oxide;
    forming an emitter window through the polysilicon raised external base down to the third layer of silicon oxide; and
    forming a cavity within the three layers of silicon oxide, the cavity having a cavity wall that comprises at least three different lengths of the three layers of silicon oxide.

18. The method as claimed in claim 17 wherein the step of forming the cavity comprises the step of:
    performing a hydrofluoric acid wet etch process through the emitter window to remove portions of the three layers of silicon oxide to form the cavity over the collector.

19. The method as claimed in claim 18 wherein each of the three layers of silicon oxide has a different wet etch rate with respect to the hydrofluoric acid wet etch process.

20. The method as claimed in claim 17 further comprising the steps of:
    applying a selective epitaxial growth procedure to form a polysilicon rich corner within the cavity under portions of the polysilicon raised external base that extend over the cavity; and
    applying a selective epitaxial growth procedure to form a monocrystalline silicon base within the cavity adjacent to the polysilicon rich corner.

* * * * *